United States Patent [19]
Zeidler

[11] 3,949,315
[45] Apr. 6, 1976

[54] OPTICAL INTERMEDIATE AMPLIFIER FOR A COMMUNICATION SYSTEM

[76] Inventor: Günter Zeidler, Weidenstrasse 25, 8034 Unterpfaffenhofen, Germany

[22] Filed: Sept. 21, 1973

[21] Appl. No.: 399,633

[30] Foreign Application Priority Data
Oct. 3, 1972 Germany............................ 2248371

[52] U.S. Cl. ........ 330/4.3; 331/94.5 E; 350/96 WG; 250/227
[51] Int. Cl.² ......................... H01S 3/05; H01S 3/09
[58] Field of Search..................... 330/4.3; 332/7.51; 331/94.5 E, 94.5 C, 94.5 D; 350/96 WG, 96 R, 164, 172; 356/112; 250/199, 227

[56] References Cited
UNITED STATES PATENTS

| | | | |
|---|---|---|---|
| 3,417,345 | 12/1968 | Cabezas et al. | 331/94.5 E |
| 3,571,737 | 3/1971 | Miller | 250/199 |
| 3,626,319 | 12/1971 | Young | 331/94.5 E |
| 3,751,655 | 8/1973 | Codrino | 350/96 R |

Primary Examiner—Maynard R. Wilbur
Assistant Examiner—N. Moskowitz
Attorney, Agent, or Firm—Hill, Gross, Simpson, Van Santen, Steadman, Chiara & Simpson

[57] ABSTRACT

An intermediate amplifier for a transmission system intended for communications transmission applications using light waves in optical wave guides employs an optical amplifier for amplifying the light waves on the laser principle, wherein an optical filter is provided to restrict the frequency band of the optical amplifier to the frequency band of the pulses being transmitted. The filter comprises a dielectric multi-layer system arranged upon an inclined surface of the optical amplifier through which the signal light passes in one embodiment. In another embodiment the filter is a zone of the output wave guide of the amplifier which has an absorption characteristic outside of the frequency band of the light pulses which are to be transmitted.

1 Claim, 4 Drawing Figures

OPTICAL INTERMEDIATE AMPLIFIER FOR A COMMUNICATION SYSTEM

BACKGROUND OF THE INVENTION

1. Field of the Invention

This invention relates to an intermediate amplifier for a transmission system intended for communications transmission applications using light waves in optical wave guides, and more particularly to such an amplifier which includes an optical amplifier for amplifying the light waves on the laser principle and to filtering techniques for restricting the frequency band of the amplifier to the frequency band of the pulses being transmitted.

2. Description of the Prior Art

In the German published application 21 41 842 an optical intermediate amplifier operating as a laser amplifier is disclosed, in which amplifier the light signals are amplified in a doped semiconductor monocrystal which functions as the active medium. In one embodiment of that invention (FIG. 1), the optical amplifier utilizes a doped single crystal semiconductor 7 which is electrically pumped by way of the elements 11 and 12 and which is disposed between and coupled to the ends of a pair of light conductors 3 and 4 by way of output couplings thereto. If desired, the end surfaces 13 and 14 (FIG. 2) of the semiconductor laser are inclined toward each other to reduce undesirable oscillations in the semiconductor material. Another embodiment of the invention (see FIG. 3) finds the amplifying material, such as a semiconductor laser 7, provided with resonator mirrors 15 and 16 which reflect the amplified light signals several times to obtain the desired mode in the amplified light signals which are then directed back to the same semiconductor 3 and subsequently separated therefrom by branching to a separate conductor. In another embodiment (FIG. 4), the material forming the laser amplifier is provided with mirrors 15 and 16 which are arranged to produce a zig-zag path through the amplifying material 7 for exit in a separate conductor 4 in a direction which is opposite to the direction of incidence wave guide 3. In still another embodiment of the invention (see FIG. 5) an optical active material 18 of a solid state laser is carried on a portion 17 of a circumferential shell 6 of a light conductor 3 and optically pumps the active material 18 to amplify surface waves in the shell 6 to obtain the amplifier signal for the information transmission system. Each embodiment is preferably formed with the wave conductor 3 through the utilization of integrated techniques.

SUMMARY OF THE INVENTION

In semiconductor lasers, the amplification factor is very high over the full band width of the laser material so that the noise component which is also produced throughout this wide band by spontaneous emission is equally amplified and injected into the wave guide.

Therefore, the object of the present invention is to reduce the amplifier noise.

In accordance with the invention, the foregoing object is achieved in that in order to restrict the frequency band of the optical amplifier to the frequency band of the pulses being transmitted, an optical filter is provided.

With this construction, the noise level is reduced and there is no transmission of any amplifier noise occurring outside the frequency band of the light pulses.

A filter of this kind advantageously consists of a dielectric multi-layer system arranged on an inclined surface of the optical amplifier through which the signal light passes.

A multi-layer system is so designed that it only transmits light within the frequency band of the light pulses being transmitted, but reflects light in a frequency range outside this frequency band. Through the inclination of the surface of the multi-layer system, the reflected light is directed to an absorptive external surface of the laser amplifier.

Another filter structure is one in which, in the wave guide, periodic changes are produced in the refractive index, the absorption or the wave guide cross section. This can be achieved by irradiation through masks, in order to produce conversion processes in the dielectric, or by the direct inclusion of absorptive materials (ion implantation), or again by corresponding etching of the wave guide.

BRIEF DESCRIPTION OF THE DRAWING

Other objects, features and advantages of the invention, its organization, construction and operation will be best understood from the following detailed description of embodiments of the invention taken in conjunction with the accompanying drawings, on which.

DESCRIPTION OF THE PREFERRED EMBODIMENTS

Figure 1:
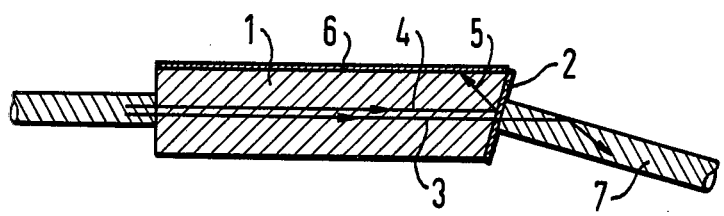
FIG. 1 is an elevational sectional illustration of a frequency selective filter constructed in accordance with the invention.

Referring to FIG. 1, a semiconductor amplifier 1 is illustrated as having a frequency selective filter which only passes in narrow frequency band containing the amplified laser signal, and which blocks the noise component in the undesired frequency band.

In the example illustrated in FIG. 1, the light exit region of the semiconductor amplifier 1 is inclined with respect to the light propagation direction, and a multi-layer system 2 is carried on the inclined surface. The multi-layer system 2 is so designed that it transmits light rays 3 which are located within the frequency band intended for transmission, but reflects light rays 4 which are located outside the frequency band. The reflected rays are directed to an external surface of the semiconductor laser 1, which surface is covered with a layer 6 of absorption material.

Figure 2:
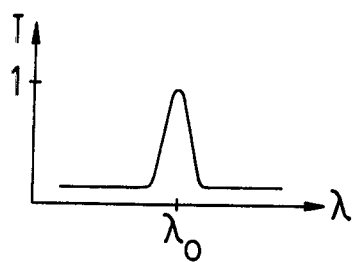
FIGS. 2 and 3 illustrate associated diagrams concerning transmission and reflection with respect to wave length.
Figure 3:
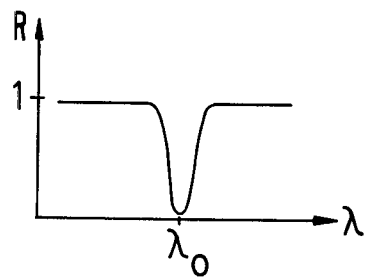

The transmission and reflection aspects of the arrangement illustrated in FIG. 1 are illustrated in FIGS. 2 and 3. These figures illustrate, in graphic form, the transmission and reflection of the light passing through the wave guide as a function of wave length. In the wave guide 7, only a very narrow zone about the wave length $\lambda_o$ of the information-bearing pulse train, is transmitted. In an equally narrow wave length range around the wave length $\lambda_o$ the reflectivity at the multi-layer system is virtually at zero, but in the remainder of the wave length range the reflectivity is substantially 1.

Figure 4:
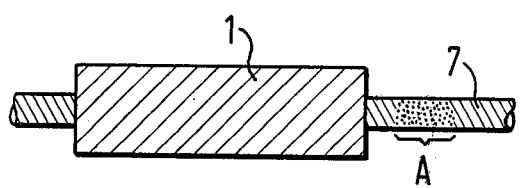
FIG. 4 is an elevational sectional view of another embodiment of the invention.

Referring now to FIG. 4, a further example of the frequency-selective filter is illustrated in which the outgoing wave guide 7 from the semiconductor amplifier 1 is doped over an interval A with a material which has a high absorption coefficient vis-a-vis light having frequencies outside the desired frequency transmission band; whereas, for light within the frequency band the material has a high transmittance.

Although I have described my invention by reference to specific illustrative examples thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An intermediate amplifier for an optical transmission system having optical wave guides, comprising an optical amplifier which amplifies light waves according to the laser principle, an incoming wave guide connected to said optical amplifier, and an outgoing wave guide connected to said optical amplifier, said outgoing wave guide including a zone having an absorption characteristic for frequencies outside of the frequency band of light pulses which are to be transmitted through the intermediate amplifier.

* * * * *